United States Patent
Oba et al.

(10) Patent No.: US 7,126,430 B2
(45) Date of Patent: Oct. 24, 2006

(54) PLL CIRCUIT

(75) Inventors: Yasuo Oba, Otsu (JP); Makoto Ikuma, Takatsuki (JP)

(73) Assignee: Matsushita Electric Industrial Co., Ltd, Osaka (JP)

( * ) Notice: Subject to any disclaimer, the term of this patent is extended or adjusted under 35 U.S.C. 154(b) by 22 days.

(21) Appl. No.: 11/059,561

(22) Filed: Feb. 17, 2005

(65) Prior Publication Data

US 2005/0184810 A1 Aug. 25, 2005

(30) Foreign Application Priority Data

Feb. 20, 2004 (JP) ............................. 2004-044921

(51) Int. Cl.
*H03L 7/00* (2006.01)
(52) U.S. Cl. ................ 331/11; 331/2; 331/10; 331/16; 331/1 R; 331/46; 327/156; 345/213; 375/376
(58) Field of Classification Search ............... 331/1 R, 331/16, 2, 10, 11, 46; 327/156; 375/376; 345/213

See application file for complete search history.

(56) References Cited

U.S. PATENT DOCUMENTS 5,657,359 A 8/1997 Sakae et al. ................ 375/376

6,512,801 B1 * 1/2003 Ninomiya ................... 375/316

FOREIGN PATENT DOCUMENTS

| JP | 266084 | 5/1990 |
| JP | 05327490 | 12/1993 |
| JP | 08186490 | 7/1996 |
| JP | 10256899 | 9/1998 |

OTHER PUBLICATIONS

Japanese Office Action dated May 18, 2006 with English translation.

* cited by examiner

*Primary Examiner*—Arnold Kinkead
(74) *Attorney, Agent, or Firm*—Stevens, Davis, Miller & Mosher, LLP

(57) ABSTRACT

The frequency of a first voltage controlled oscillator is stabilized in a first PLL circuit part into which a reference frequency signal is inputted. In addition, a second PLL circuit part is formed by inputting a control voltage which is the same as the frequency control voltage of the first voltage controlled oscillator into a second voltage controlled oscillator having the same configuration as the first voltage controlled oscillator. The first PLL circuit part is provided with first and second variable frequency dividers which respectively divide the reference frequency signal and the output of the first voltage controlled oscillator. In response to an input signal into the second PLL circuit part, the free-running frequencies of the second and first voltage controlled oscillators are switched, and at the same time, the division ratio of first and second variable frequency dividers are switched.

5 Claims, 5 Drawing Sheets

PLL CIRCUIT

BACKGROUND OF THE INVENTION

1. Field of the Invention

The present invention relates to a PLL circuit that utilizes a voltage controlled oscillator which is built into a semiconductor integrated circuit, and which has little dispersion in free-running frequency.

2. Prior Art

In recent years, reduction in accessory parts and cost for adjustment has come into demand, as the price of television receivers and the like has lowered. In addition, oscillators which used to be difficult to completely build into an integrated circuit have been integrated, and the required performance thereof has also been increased.

From among these, the degree of stability of free-running frequency in a voltage controlled oscillator that forms a PLL circuit greatly influences the performance of the formed PLL circuit, and in some cases, causes an unlocking phenomenon. Therefore, it is particularly important to stabilize free-running frequency.

Furthermore, in some cases, a number of frequencies are applied, depending on the applied system. In such a case, a system which makes switching of free-running frequency possible and which achieves stability in free-running frequency becomes necessary. The video intermediate frequency in a video detection circuit of a television receiver, for example, differs between Japan, where the frequency is 58.75 MHz, and the United States, where the frequency is 45.75 MHz. Such a video detection circuit needs to correspond to the two types of input frequencies within the same integrated circuit in order to lower the production costs. In addition, the reference frequency signal source also needs to correspond to a number of frequencies, for example, 4 MHz and 3.58 MHz in the case of a television receiver.

In the following, a PLL circuit where stabilization in the frequency is achieved according to the prior art is described in reference to FIG. 4.

The PLL circuit according to the prior art is formed of first and second PLL circuit parts 100 and 101. First PLL circuit part 100 is formed of a first phase detector 1, a first low pass filter 2 and a first voltage controlled oscillator 3. Second PLL circuit part 101 is formed of a second voltage controlled oscillator 7, a second phase detector 9, a second low pass filter 6 and a frequency control circuit 5 for supplying a frequency control voltage to first and second voltage controlled oscillators 3 and 7.

The operation of the conventional PLL circuit which is formed as described above is described below. In FIG. 4, the output of voltage controlled oscillator 3 is inputted into phase detector 1, and a phase comparison is carried out between the output and an input signal that is inputted into a signal input terminal 11. Then, the results of phase comparison by phase comparator 1 are smoothed by low pass filter 2 to a frequency control voltage, which is then fed back to voltage controlled oscillator 3. As a result of this, the configuration of PLL circuit part 100 allows for an operation where the frequency of the input signal into signal input terminal 11 and the frequency of voltage controlled oscillator 3 become equal. At this time, the input signal into signal input terminal 11 and the output signal of voltage controlled oscillator 3 have a phase difference of 90 degrees.

Meanwhile, the reference frequency signal that has been inputted into a reference frequency signal input terminal 13 is inputted into phase detector 9, and the difference in the frequency (phase difference) between the reference frequency signal and the output of voltage controlled oscillator 7 is detected. The output of phase detector 9 is inputted into low pass filter 6. The output of a crystal oscillator or the like of which the frequency stability is excellent is conventionally utilized as the reference frequency signal. Low pass filter 6 smoothes the output of phase detector 9, which is supplied to voltage controlled oscillator 7 as a frequency control voltage through frequency control circuit 5. As a result of this, the configuration of PLL circuit part 101 allows for an operation where the frequency of voltage controlled oscillator 7 becomes equal to the frequency of the reference frequency signal.

Here, voltage controlled oscillator 3 and voltage controlled oscillator 7 have the same circuit configuration, and are formed using the same elements. In addition, circuits for outputting frequency control voltages to voltage controlled oscillator 3 and voltage controlled oscillator 7 have the same circuit configuration and are respectively formed using the same elements, in frequency control circuit 5.

Next, the operation of frequency control circuit 5 is described using the example of FIG. 5. In FIG. 5, symbol 22 indicates a terminal into which the output of low pass filter 6 is inputted. Symbol 23 indicates a power supply terminal. Symbol 24 indicates a reference voltage terminal. The reference voltage that is provided to reference voltage terminal 24 is set so that the output of low pass filter 6 adjusts the oscillatory frequency range of voltage controlled oscillators 3 and 7 to a desired frequency range. Symbols 25 and 26 indicate output terminals of frequency control circuit 5, which are respectively connected to voltage controlled oscillators 3 and 7. Symbol 27 indicates a ground terminal. In addition, symbols I1 and I2 indicate constant current sources. Symbols Q4 and Q5 indicate PNP transistors that form a differential amplifier for converting a voltage to a current. Symbols Q1, Q2 and Q3 indicate NPN transistors that form a current mirror circuit. Symbols R1, R2, R3 and R4 indicate resistors.

In this frequency control circuit, the output of the low pass filter that is inputted into terminal 22 is compared with the reference voltage of reference voltage terminal 24, and is converted to a frequency control current so as to be inputted into NPN transistor Q1 and resistor R1. Gain gm of this voltage current conversion is determined by resistor R4. The frequency control current that has been inputted into NPN transistor Q1 and resistor R1 is supplied to voltage controlled oscillators 3 and 7 via output terminals 25 and 26 by means of NPN transistors Q2 and Q3 that form the current mirror circuit, and thereby, the oscillation frequencies of voltage controlled oscillators 3 and 7 are controlled.

Phase comparison is carried out between the output frequency of voltage controlled oscillator 7 and the signal of the reference frequency that is inputted into reference frequency signal input terminal 13 in phase comparator 9, and thereby, the output frequency is synchronized with the reference frequency signal. Therefore, a correcting current corresponding to a shift from the reference frequency in the case where a change in the temperature or dispersion during the process of mass production of semiconductors exists is supplied from transistor Q3 of FIG. 5. As a result of this, the output frequency of voltage controlled oscillator 7 becomes very stable, irrespectively of temperature and dispersion during the process.

Here, in the case where voltage controlled oscillators 3 and 7 have the same elements and the same configuration, being formed of NPN transistors Q2 and Q3 and resistors R2 and R3 of the same elements, a correcting current that is equal to that of voltage controlled oscillator 7 is supplied to voltage controlled oscillator 3 from NPN transistor Q2 of FIG. 5. As a result, the free-running frequency of voltage controlled oscillator 3 becomes very stable, even in the case where there is a change in the temperature and dispersion during the process.

Meanwhile, in response to the input signal that is inputted into signal input terminal 11, PLL circuit 100 locks by means of the frequency control current from low pass filter 2, in the state where the free-running frequency of voltage control oscillator 3 is stable. As a result, it is possible for voltage controlled oscillator 3 to operate stably without unlocking, even in the case where there is a change in the temperature and dispersion during the process.

In this configuration, the oscillatory frequency of voltage controlled oscillator 3 is controlled by a frequency control voltage which has the same temperature dependency and dispersion dependency as the oscillatory frequency of voltage controlled oscillator 7. The oscillatory frequency of voltage controlled oscillator 7 is made to be equal to the reference frequency by means of PLL circuit part 101, and has extremely little dependency on temperature and dispersion of elements. Accordingly, the free-running frequency of voltage controlled oscillator 3 which is controlled by the frequency control voltage that is the same as that of voltage controlled oscillator 7 has extremely little fluctuation, irrespectively of temperature and mass production, thus making it possible to achieve stabilization.

Patent Document 1: Japanese Unexamined Patent Publication H10 (1998)-256899

However, the PLL circuit according to the prior art which is formed as shown in FIG. 4, cannot handle a case where there are a number of input frequencies and reference frequency signal sources. Therefore, in order to apply this type of PLL circuit to a television receiver and the like, it is necessary to prepare PLL circuits having voltage controlled oscillators and reference frequency signal sources for different frequencies in accordance with the applied frequencies, which is extremely disadvantageous, taking reduction in costs into consideration.

SUMMARY OF THE INVENTION

The present invention is provided in order to solve the above described conventional problems, and an object thereof is to provide a PLL circuit that can handle a number of frequencies in one set of circuits.

In order to achieve the above described object, a PLL circuit according to the first invention is provided with: a first voltage controlled oscillator; a first phase comparator for detecting a phase difference between an input signal and the output of the first voltage controlled oscillator; a first filter into which the output of the first phase comparator is inputted, and which supplies a frequency control voltage to the first voltage controlled oscillator; a first variable frequency divider for dividing the reference frequency signal outputted from a reference frequency signal source; a second voltage controlled oscillator having the same elements and configuration as the first voltage controlled oscillator; a second variable frequency divider for dividing the output of the second voltage controlled oscillator; a second phase comparator for detecting a phase difference between the outputs of the first variable frequency divider and the second variable frequency divider; a second filter into which the output of the second phase comparator is inputted; a frequency control means into which the output of the second filter is inputted, and which respectively controls the frequencies of the first voltage controlled oscillator and the second voltage controlled oscillator, with circuits having the same configuration; and a frequency switching means for respectively switching the frequencies of the first voltage controlled oscillator and the second voltage controlled oscillator in accordance with a frequency switching signal, with circuits having the same configuration. At least either of the first variable frequency divider and the second variable frequency divider switches the division ratio in accordance with the frequency switching signal.

In this configuration, the frequencies of the first voltage controlled oscillator and the second voltage controlled oscillator are switched in accordance with the frequency switching signal, and at least one of the division ratios of the first variable frequency divider and the second variable frequency divider is switched in accordance with the frequency switching signal. Therefore, one set of circuits can handle a number of frequencies, and thus, reduction in the costs can be achieved in the case where a number of frequencies are handled.

In the above described configuration of the first invention, the reference frequency signal source may be of a frequency switching type, and at least either of the first variable frequency divider and the second variable frequency divider may switch the division ratio in accordance with the switching of the frequency of the reference frequency signal source.

In this configuration, one set of circuits can handle a number of reference frequency signals, and thus, reduction in the costs can be achieved in the case where a number of frequencies are handled.

A PLL circuit according to the second invention is provided with: a first voltage controlled oscillator; a phase shifter into which the output of the first voltage controlled oscillator is inputted, and which outputs first and second signals having a shift difference of 90 degrees; a first phase comparator for detecting a phase difference between the first signal of the phase shifter and a video intermediate frequency signal; a first filter into which the output of the first phase comparator is inputted, and which supplies a frequency control voltage to the first voltage controlled oscillator; a video detector into which the video intermediate frequency signal and the second signal of the phase shifter are inputted, and which carries out a synchronous detection; a first variable frequency divider for dividing the reference frequency signal outputted from a reference frequency source; a second voltage controlled oscillator having the same elements and configuration as the first voltage controlled oscillator; a second variable frequency divider for dividing the output of the second voltage controlled oscillator; a second phase comparator for detecting a shift difference between the outputs of the first variable frequency divider and the second variable frequency divider; a second filter into which the output of the second phase comparator is inputted; a frequency control means into which the output of the second filter is inputted, and which respectively controls the frequencies of the first voltage controlled oscillator and the second voltage controlled oscillator with circuits having the same configuration; and a frequency switching means for respectively switching the frequencies of the first voltage controlled oscillator and the second voltage controlled oscillator in accordance with a frequency switching signal, with circuits having the same configuration. At least either of the first variable frequency divider and the second variable frequency divider switches the division ratio in accordance with the frequency switching signal.

In this configuration, the frequencies of the first voltage controlled oscillator and the second voltage controlled oscillator are switched in accordance with the frequency switching signal, and at least one of the division ratios of the first variable frequency divider and the second variable frequency divider is switched in accordance with the frequency switching signal. Therefore, one set of circuits can handle a number of frequencies, and thus, reduction in the costs can be achieved in the case where a number of frequencies are handled. In addition, a synchronous detection can be carried out on the video intermediate frequency signal.

In the above described configuration of the second invention, the reference frequency signal source may be of a frequency switching type, and at least either of the first variable frequency divider and the second variable frequency divider may switch the division ratio in accordance with the switching of the frequency of the reference frequency signal source.

In this configuration, one set of circuits can handle a number of reference frequency signals, and thus, reduction in the costs can be achieved in the case where a number of frequencies are handled.

In addition, the above described configuration of the second invention may further be provided with a frequency adjusting means for correcting a difference between the frequency of the first voltage controlled oscillator and the free-running frequency of the second voltage controlled oscillator.

In this configuration, dispersion in the properties between the first and second voltage controlled oscillators during manufacture can be corrected, and thus, a PLL operation having higher precision becomes possible.

The frequency of the second voltage controlled oscillator which has been stabilized by the PLL operation that utilizes a reference frequency signal is switched in the PLL circuit of the first invention, which, thereby, can handle two or more different frequencies of the first voltage controlled oscillator which are controlled by the same frequency control voltage. In this configuration, the frequency of the first voltage controlled oscillator can be stabilized, and thus, it is possible to gain a PLL circuit having excellent properties.

In addition, also in the case where the frequency of the reference frequency signal is switched in the second voltage controlled oscillator which has been stabilized by means of the PLL operation that utilizes the reference frequency signal, the PLL circuit handles two or more different reference frequencies of the first voltage controlled oscillator which are controlled by the same frequency control voltage. In this configuration, the frequency of the first voltage controlled oscillator can be stabilized, and thus, it is possible to gain a PLL circuit having excellent properties.

The frequency of the second voltage controlled oscillator which has been stabilized by the PLL operation that utilizes a reference frequency signal is switched in the PLL circuit of the second invention, which, thereby, can handle two or more different frequencies of the first voltage controlled oscillator which are utilized for a video detector and controlled by the same frequency control voltage. In this configuration, the frequency of the first voltage controlled oscillator can be stabilized, and thus, it is possible to gain a video detection circuit having excellent properties.

In addition, also in the case where the frequency of the reference frequency signal is switched in the second voltage controlled oscillator which has been stabilized by means of the PLL operation that utilizes the reference frequency signal, the PLL circuit handles two or more different reference frequencies of the first voltage controlled oscillator which are utilized for a video detector and controlled by the same frequency control voltage. In this configuration, the frequency of the first voltage controlled oscillator can be stabilized, and thus, it is possible to gain a video detection circuit having excellent properties.

Furthermore, the oscillatory frequency of the second voltage controlled oscillator can be adjusted, and thereby, it becomes possible to gain a PLL circuit having high frequency precision.

DESCRIPTION OF THE PREFERRED EMBODIMENTS (Embodiment 1)

In the following, a PLL circuit according to Embodiment 1 of the present invention is described in reference to FIG. 1.

Figure 1:
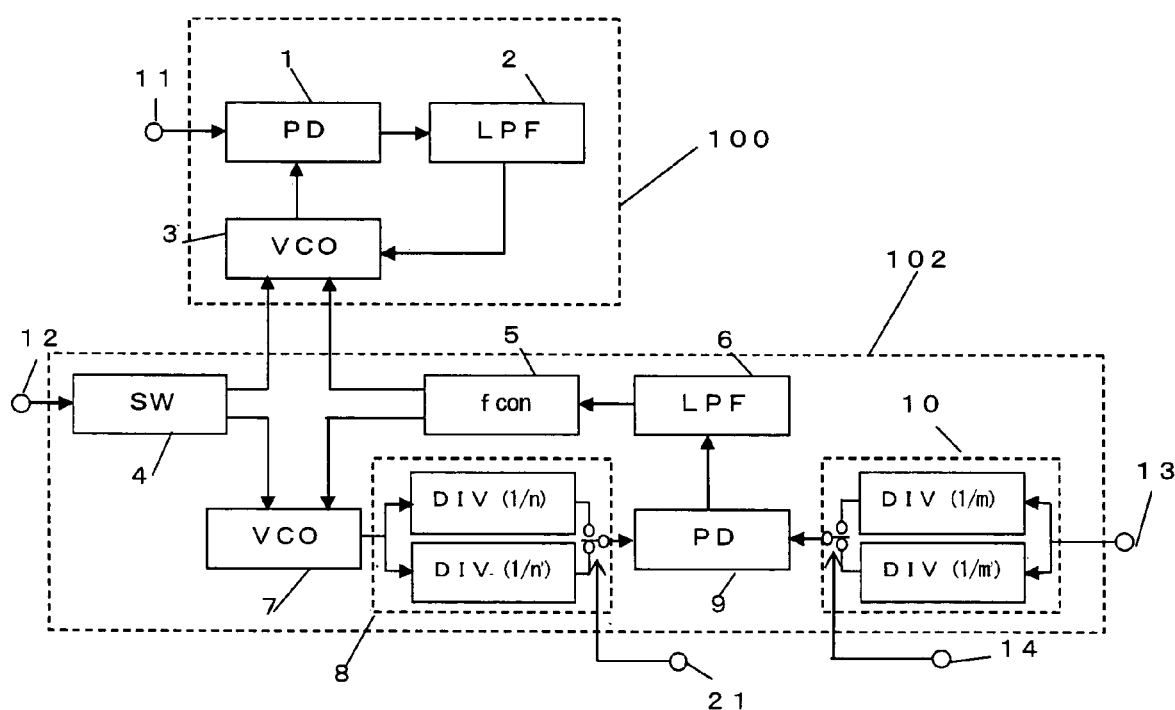
FIG. 1 is a block diagram showing the configuration of a PLL circuit according to Embodiment 1 of the present invention.

FIG. 1 is a block diagram showing the configuration of a PLL circuit according to Embodiment 1 of the present invention, and the same symbols are used for parts that are the same as in the prior art.

This PLL circuit is formed of first and second PLL circuit parts 100 and 102. First PLL circuit part 100 is formed of a first phase detector 1, a first low pass filter 2 and a first voltage controlled oscillator 3. Second PLL circuit part 102 is formed of a second voltage controlled oscillator 7, a second phase detector 9, a second low pass filter 6, a frequency control circuit 5 for supplying a frequency control voltage to first and second voltage controlled oscillators 3 and 7, a first variable frequency divider 10, a second variable frequency divider 8 and a frequency switching circuit 4.

Here, voltage controlled oscillator 3 and voltage controlled oscillator 7 have the same circuit configuration and are formed using the same elements. Circuits for outputting frequency control voltages to voltage controlled oscillator 3 and voltage controlled oscillator 7 have the same circuit configuration and are respectively formed using the same elements, in frequency control circuit 5.

In addition, a frequency switching signal is inputted through a frequency switching signal input terminal 12 into frequency switching circuit 4, which thereby respectively switches the frequencies of voltage controlled oscillator 3 and voltage controlled oscillator 7 with circuits having the same configuration.

The operation of a PLL circuit according to Embodiment 1 of the present invention which is formed as described above is described below.

In FIG. 1, the output of voltage controlled oscillator 3 is inputted into phase detector 1, and phase comparison is carried out between the output and an input signal that is inputted into signal input terminal 11. Then, the results of the phase comparison by phase comparator 1 are smoothed by low pass filter 2 to a frequency control voltage, which is then fed back to voltage controlled oscillator 3. As a result of this, the configuration of PLL circuit part 100 allows for an operation where the frequency of the input signal of signal input terminal 11 and the frequency of voltage controlled oscillator 3 become equal. At this time, the input signal into signal input terminal 11 and the output signal of voltage controlled oscillator 3 have a phase difference of 90 degrees.

Meanwhile, in FIG. 1, the reference frequency signal that has been inputted into a reference frequency signal input terminal 13 is inputted into variable frequency divider 10 so as to be divided in a manner where a desired comparison frequency fref is gained, which, after that, is inputted into phase detector 9. At this time, the division ratio of variable frequency divider 10 is 1/m.

In addition, the output of voltage controlled oscillator 7 is inputted into variable frequency divider 8, and is divided so as to gain a comparison frequency fref, which is then inputted into phase detector 9. At this time, the division ratio of variable frequency divider 8 is 1/n.

A frequency difference (phase difference) between the output signals of variable frequency dividers 10 and 8 is detected by phase detector 9, which inputs an output that corresponds to this frequency difference into low pass filter 6. The output of a crystal oscillator or the like having an excellent frequency stability is conventionally utilized as this reference frequency signal.

Low pass filter 6 smoothes the output of phase detector 9 which passes through frequency control circuit 5 and is supplied to voltage controlled oscillator 7 as a frequency control voltage. As a result of this, the configuration of PLL circuit part 102 allows for an operation where the frequency of voltage controlled oscillator 7 becomes equal to n/m times the frequency of the reference frequency signal.

Frequency switching circuit 4 sets the free-running frequencies of voltage controlled oscillator 3 and voltage controlled oscillator 7 at a desired first frequency in accordance with a frequency switching signal that is inputted into frequency switching signal input terminal 12. The division ratio (1/n) of variable frequency divider 8 is set so that the output frequency becomes equal to comparison frequency fref, by means of a signal from a division ratio control terminal 21. In addition, variable frequency divider 10 sets the division ratio (1/m) so that the output frequency becomes comparison frequency fref, by means of a signal from a division ratio control terminal 14.

In addition, voltage controlled oscillator 3 and voltage controlled oscillator 7 have the same circuit configuration and are formed using the same elements. Circuits for outputting frequency control voltages to voltage controlled oscillator 3 and voltage controlled oscillator 7 have the same circuit configuration and are respectively formed using the same elements, in frequency control circuit 5.

In this configuration, the oscillatory frequency of voltage controlled oscillator 3 is controlled by a frequency control voltage which has the same dependency on temperature and dispersion as that of the oscillatory frequency of voltage controlled oscillator 7. The oscillatory frequency of voltage controlled oscillator 7 becomes equal to n/m times the reference frequency by means of PLL circuit part 102, and has extremely low dependency on temperature and dispersion of elements. Therefore, the free-running frequency of voltage controlled oscillator 3 that is controlled by the frequency control voltage that is the same as that of voltage controlled oscillator 7 has extremely low fluctuation, irrespectively of temperature and mass production, thus making it possible to achieve stabilization.

Accordingly, a change in the free-running frequency of voltage controlled oscillator 3 that operates in PLL circuit part 100 is small, and therefore, PLL circuit part 100 has excellent properties.

Next, in the case where a different input frequency is handled, the free-running frequencies of voltage controlled oscillator 3 and voltage controlled oscillator 7 are switched to a second frequency in accordance with the frequency switching signal that is inputted into frequency switching signal input terminal 12. Then, in response to this frequency, that is to say, in response to the frequency switching signal, the division ratio (1/n') of variable frequency divider 8 is set so that the output frequency becomes equal to comparison frequency fref, by means of a signal from division ratio control terminal 21. In order to simply carry out the switching of this division ratio, as shown in variable frequency divider 8 of FIG. 1, the output signal of voltage controlled oscillator 7 may be inputted into a number of frequency dividers for gaining a desired division ratio so as to switch the outputs of the number of frequency dividers. In addition, a programmable frequency divider where the division ratio can be switched to an arbitrary ratio may be used.

In this configuration, in the same manner as in the above described case of the first input frequency, the oscillatory frequency of voltage controlled oscillator 3 can be controlled by a frequency control voltage which has the same dependency on temperature and dispersion as that of the oscillatory frequency of voltage controlled oscillator 7 for the second input frequency. The oscillatory frequency of voltage controlled oscillator 7 becomes equal to n'/m times the reference frequency by means of PLL circuit part 102, and has extremely low dependency on the temperature and the dispersion of elements. Therefore, the free-running frequency of voltage controlled oscillator 3, which is controlled by a frequency control voltage that is the same as that of voltage controlled oscillator 7, has extremely low fluctuation, irrespectively of temperature and mass production, making it possible to achieve stabilization.

Accordingly, change in the free-running frequency of voltage controlled oscillator 3 which operates in PLL circuit part 100 is small, and therefore, PLL circuit part 100 has excellent properties.

In order to form the PLL circuit of Embodiment 1 under the assumption that, for example, the first input frequency is 58.75 MHz, the second input frequency is 45.75 MHz, and the frequency of the reference frequency signal source is 4 MHz, the following setting is provided. With regards to the first input frequency, the free-running frequencies of voltage controlled oscillator 3 and voltage controlled oscillator 7 are set at 58.75 MHz, comparison frequency fref is set at 250 kHz, the division ratio of variable frequency divider 8 is set at n=235, and the division ratio of variable frequency divider 10 is set at m=16. In addition, with regards to the second input frequency, the free-running frequencies of voltage controlled oscillator 3 and voltage controlled oscillator 7 are set at 45.75 MHz, comparison frequency fref is set at 250 kHz, the division ratio of variable frequency divider 8 is set at n=183, and the division ratio of variable frequency divider 10 is set at m=16. Thus, a PLL circuit according to Embodiment 1 of the present invention can be formed.

Next, a case is described where a free-running frequency that is different from the input frequency into voltage controlled oscillator 7 is set. For the first input frequency, the free-running frequency of voltage controlled oscillator 7 is set at 55 MHz, comparison frequency fref is set at 1 MHz, the division ratio of variable frequency divider 8 is set at n=55, and the division ratio of variable frequency divider 10 is set at m=4. In addition, for the second input frequency, the free-running frequency is set at 50 MHz, comparison frequency fref is set at 1 MHz, the division ratio of variable frequency divider 8 is set at n'=50, and the division ratio of variable frequency divider 10 is set at m=4. In the above described manner, a PLL circuit according to Embodiment 1 of the present invention can be formed.

Here, it is possible to set the free-running frequencies of voltage controlled oscillator 3 and voltage controlled oscillator 7 at different frequencies. However, in this configuration, relative dispersion may occur in the temperature dependency of the free-running frequency between two voltage controlled oscillators 3 and 7, due to relative dispersion of the elements at the time of mass production. In order to reduce the relative dispersion, it is desirable for the free-running frequencies of the two voltage controlled oscillators 3 and 7 to have values that are close.

In addition, it is desirable to avoid oscillatory frequencies of which the values multiplied by respective integers make equal values, in order to avoid interference between the frequencies of the two oscillators. In the case where, for example, the frequencies of voltage controlled oscillators 3 and 7 are 50 MHz and 40 MHz, respectively, the frequencies gained by multiplying 50 MHz by 4 and 40 MHz by 5 are equal, and a problem of interference between the higher harmonics may arise. In such a case, the frequency of voltage controlled oscillator 7 may be shifted and set at 39.9 MHz or the like.

Next, in the PLL circuit of this Embodiment 1 shown in FIG. 1, a case is described where the frequency of the reference frequency signal that is inputted from reference frequency signal input terminal 13 is switched to either the first reference frequency or the second reference frequency. In the case where the first reference frequency is utilized, the division ratio of variable frequency divider 10 is set at the first division ratio (1/m) by means of a signal from division ratio control terminal 14. In the case where the second reference frequency is utilized, the division ratio is set at the second division ratio (1/m'). As a result of this, comparison frequency fref can be made constant, even in the case where the reference frequency is changed, and a stable PLL circuit as described above can be formed. In order to simplify this switching of the division ratio in the configuration, as shown in variable frequency divider 10 of FIG. 1, the reference frequency signal is inputted into a number of frequency dividers for gaining a desirable division ratio so as to switch between the outputs of the number of frequency dividers. In addition, a programmable frequency divider for switching the division ratio to an arbitrary value may be used.

In the case where, for example, the input frequency is 45.75 MHz, the comparison frequency is 10 kHz and the reference frequency is switched to either 4 MHz or 3.58 MHz, the following setting is provided. For a reference frequency of 4 MHz, the division ratio of variable frequency divider 10 is set at m=400, and the division ratio of variable frequency divider 8 is set at n=4575. In addition, for a reference frequency of 3.58 MHz, the division ratio of variable frequency divider 10 is set at m'=358, and the division ratio of variable frequency divider 8 is set at n=4575. In the above described manner, a PLL circuit according to Embodiment 1 of the present invention can be formed.

Here, in some cases, the division ratios of both of variable frequency dividers 8 and 10 may be switched.

(Embodiment 2)

In the following, a PLL circuit according to Embodiment 2 of the present invention is described in reference to FIG. 2.

Figure 2:
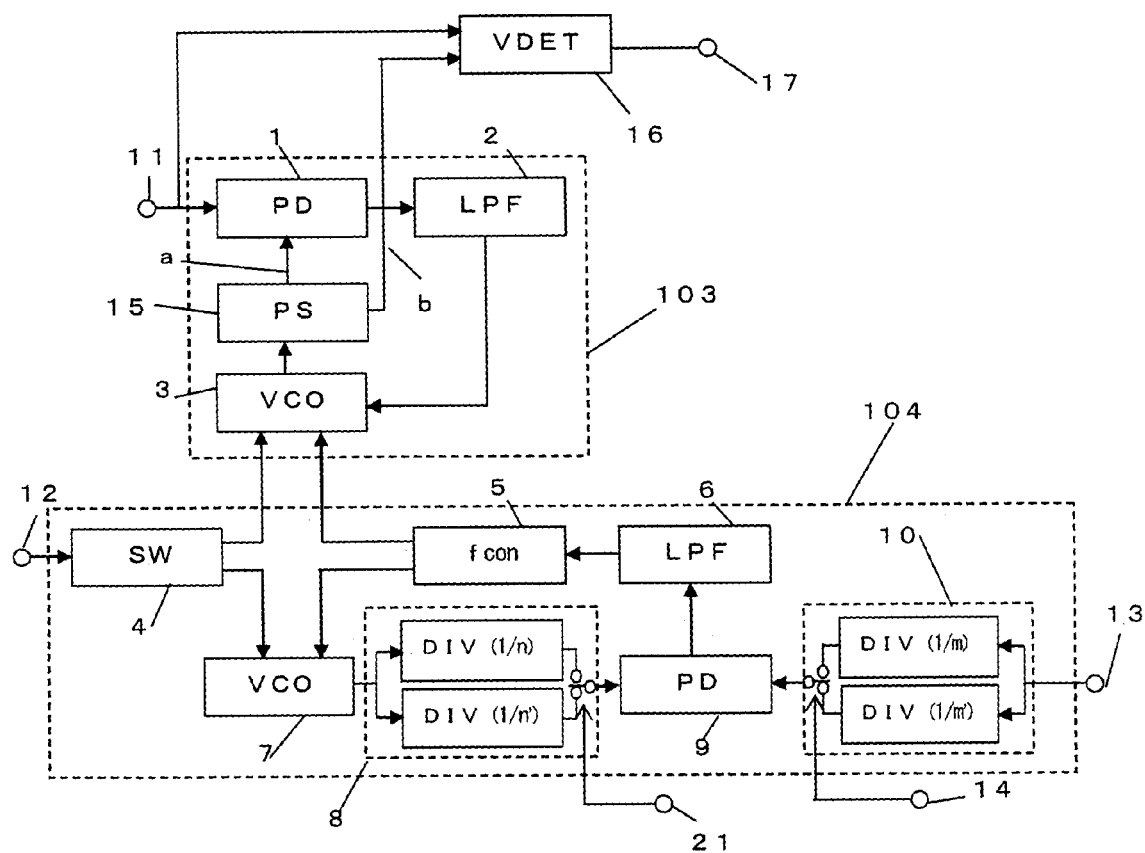
FIG. 2 is a block diagram showing the configuration of a PLL circuit according to Embodiment 2 of the present invention.

FIG. 2 is a block diagram showing the configuration of the PLL circuit according to Embodiment 2 of the present invention, and the same numbers are attached to parts that are the same as those of Embodiment 1.

This PLL circuit is formed of first and second PLL circuit parts 103 and 104. First PLL circuit part 103 is formed of a first phase detector 1, a first low pass filter 2, a first voltage controlled oscillator 3 and a phase shifter 15. Second PLL circuit part 104 is formed of a second voltage controlled oscillator 7, a second phase detector 9, a second low pass filter 6, a frequency control circuit 5 for supplying a frequency control voltage to first and second voltage controlled oscillators 3 and 7, a first variable frequency divider 10, a second variable frequency divider 8 and a frequency switching circuit 4.

The operation of the PLL circuit according to Embodiment 2 of the present invention which is formed as described above is described below.

In FIG. 2, the output of voltage controlled oscillator 3 is inputted into phase shifter 15. First signal a and second signal b between which there is a phase difference of 90 degrees are outputted from phase shifter 15. From these two, first signal a is inputted into phase detector 1 so that phase comparison is carried out between first signal a and a video intermediate frequency signal that is inputted from a signal input terminal 11. Then, the results of the phase comparison by phase comparator 1 are smoothed by low pass filter 2 so as to become a frequency control voltage which is then fed back to voltage controlled oscillator 3. As a result of this, the configuration of PLL circuit part 103 allows for an operation where the input signal into signal input terminal 11 and the frequency of voltage controlled oscillator 3 become equal. At this time, the video intermediate frequency signal, which is an input signal into signal input terminal 11, and output signal a of phase shifter 15 have a phase difference of 90 degrees.

Meanwhile, second output b of phase shifter 15 is inputted into video detector 16, together with the video intermediate frequency signal. In the case where, in order for these two signals to have the same phase, phase shifter 15 is formed so that the phase difference between output signals a and b becomes 90 degrees, video detector 16 operates as a synchronous detector.

Meanwhile, in FIG. 2, the reference frequency signal that has been inputted from reference frequency signal input terminal 13 is inputted into variable frequency divider 10 so as to be divided in order to gain a desired comparison frequency fref, which, after that, is inputted into phase detector 9. At this time, the division ratio of variable frequency divider 10 is 1/m.

In addition, the output of voltage controlled oscillator 7 is inputted into variable frequency detector 8, and is divided in order to gain comparison frequency fref, which is then inputted into phase detector 9. At this time, the division ratio of variable frequency detector 8 is 1/n.

In phase detector 9, the frequency difference (phase difference) between the output signals of variable frequency dividers 10 and 8 is detected, and the output which is in accordance with this frequency difference is inputted into low pass filter 6. An output of a crystal oscillator or the like having excellent stability in the frequency is conventionally utilized as such a reference frequency signal.

Low pass filter 2 smoothes the output of phase detector 9, which passes through frequency control circuit 5 and is supplied to voltage controlled oscillator 7 as a frequency control voltage. As a result of this, the configuration of PLL circuit part 104 allows for an operation where the frequency of voltage controlled oscillator 7 is equal to n/m times the frequency of the reference frequency signal.

Frequency switching circuit 4 sets the free-running frequencies of voltage controlled oscillator 3 and voltage controlled oscillator 7 at a desirable first frequency, in accordance with a frequency switching signal that is inputted from a frequency switching signal input terminal 12. The division ratio (1/n) of variable frequency divider 8 is set so that the output frequency becomes equal to comparison frequency fref, by means of a signal from a division ratio control terminal 21. In addition, invariable frequency divider 10, the division ratio (1/m) is set so that the output frequency becomes comparison frequency fref, by means of a division ratio control terminal 14.

In addition, voltage controlled oscillator 3 and voltage controlled oscillator 7 are formed using the same circuit configuration and the same elements. In frequency control circuit 5, circuits for outputting frequency control voltages to voltage controlled oscillator 3 and voltage controlled oscillator 7 are respectively formed utilizing the same circuit configuration and the same elements.

In this configuration, the oscillatory frequency of voltage controlled oscillator 3 is controlled by a frequency control voltage which has the same dependency on temperature and dispersion as that of the oscillatory frequency of voltage controlled oscillator 7. The oscillatory frequency of voltage controlled oscillator 7 becomes equal to n/m times the reference frequency by means of PLL circuit part 104, and has extremely low dependency on temperature and dispersion of elements. Therefore, the oscillatory frequency of voltage controlled oscillator 3 that is controlled by the frequency control voltage that is the same as that of voltage controlled oscillator 7 has extremely low fluctuation, irrespectively of temperature and mass production, thus making it possible to achieve stabilization.

A PLL circuit that is utilized for a television video detection circuit conventionally requires extremely high stability in order to secure good video properties. Therefore, a video detector having excellent properties can be formed by adopting a PLL circuit of the present invention.

Next, in the case where a different input frequency is handled, free-running frequencies of voltage controlled oscillator 3 and voltage controlled oscillator 7 are switched to a second frequency, in accordance with a frequency switching signal that is inputted from a frequency switching signal input terminal 12. Then, in response to this frequency, that is to say, in response to the frequency switching signal, the division ratio (1/n') of variable frequency divider 8 is set so that the output frequency becomes equal to comparison frequency fref, by means of a signal from division ratio control terminal 21.

In this configuration, in the same manner as in the case of the above described first input frequency, the oscillatory frequency of voltage controlled oscillator 3 is controlled by a frequency control voltage which has the same dependency on temperature and dispersion as that of the oscillatory frequency of voltage controlled oscillator 7. The oscillatory frequency of voltage controlled oscillator 7 becomes equal to n'/m times the reference frequency by means of PLL circuit part 104, and has extremely low dependency on temperature and dispersion of elements. Therefore, the oscillatory frequency (free-running frequency) of voltage controlled oscillator 3 that is controlled by the frequency control voltage that is the same as that of voltage controlled oscillator 7 has extremely low fluctuation, irrespectively of temperature and mass production, thus making it possible to achieve stabilization.

In order to form a PLL circuit of Embodiment 2 under the assumption that, for example, the first input frequency is 58.75 MHz, the second input frequency is 45.75 MHz, and the frequency of the reference frequency signal source is 4 MHz, the following setting is provided. For the first input frequency, free-running frequencies of voltage controlled oscillator 3 and voltage controlled oscillator 7 are set at 58.75 MHz, comparison frequency fref is set at 250 kHz, the division ratio of variable divider 8 is set at n=235, and the division ratio of variable frequency divider 10 is set at m=16. In addition, for the second input frequency, free-running frequencies of voltage controlled oscillator 3 and voltage controlled oscillator 7 are set at 45.75 MHz, comparison frequency fref is set at 250 kHz, the division ratio of variable divider 8 is set at n'=183, and the division ratio of variable frequency divider 10 is set at m=16. In the above described manner, a PLL circuit according to Embodiment 2 of the present invention can be formed.

Next, a case is described where a free-running frequency that is different from the input frequency into voltage controlled oscillator 7 is set. For the first input frequency, the free-running frequency of voltage controlled oscillator 7 is set at 55 MHz, comparison frequency fref is set at 1 MHz, the division ratio of variable frequency divider 8 is set at n=55, and the division ratio of variable frequency divider 10 is set at m=4. In addition, for the second input frequency, the free-running frequency is set at 50 MHz, comparison frequency fref is set at 1 MHz, the division ratio of variable frequency divider 8 is set at n'=50, and the division ratio of variable frequency divider 10 is set at m=4. In the above described manner, a PLL circuit according to Embodiment 2 of the present invention can be formed.

Here, it is possible to set the free-running frequencies of voltage controlled oscillator 3 and voltage controlled oscillator 7 at different frequencies. In such a setting, however, a relative dispersion may occur in the temperature dependency of the free-running frequencies of the two voltage controlled oscillators 3 and 7 as a result of relative dispersion in the elements at the time of mass production. In order to reduce the relative dispersion, it is desirable for the free-running frequencies of the two voltage controlled oscillators 3 and 7 to have values that are close.

Next, in the PLL circuit of this Embodiment 2 shown in FIG. 2, a case is described where the frequency of the reference frequency signal that is inputted from reference frequency signal input terminal 13 is switched to either the first reference frequency or the second reference frequency. In the case where the first reference frequency is utilized, the division ratio of variable frequency divider 10 is set at the first division ratio (1/m) by means of a signal from division ratio control terminal 14, and in the case where the second reference frequency is utilized, the division ratio is set at the second division ratio (1/m'). As a result of this, comparison frequency fref can be made constant, even in the case where the reference frequency is changed, and a stable PLL circuit as described above can be formed.

In the case where, for example, the input frequency is 45.75 MHz, the comparison frequency is 10 kHz and the reference frequency is switched to either 4 MHz or 3.58 MHz, the following setting is provided. For a reference frequency of 4 MHz, the division ratio of variable frequency divider 10 is set at m=400, and the division ratio of variable frequency divider 8 is set at n=4575. In addition, for a reference frequency of 3.58 MHz, the division ratio of variable frequency divider 10 is set at m'=358, and the division ratio of variable frequency divider 8 is set at n=4575. In the above described manner, a PLL circuit according to Embodiment 2 of the present invention can be formed.

(Embodiment 3)

In the following, a PLL circuit according to Embodiment 3 of the present invention is described in reference to FIG. 3.

Figure 3:
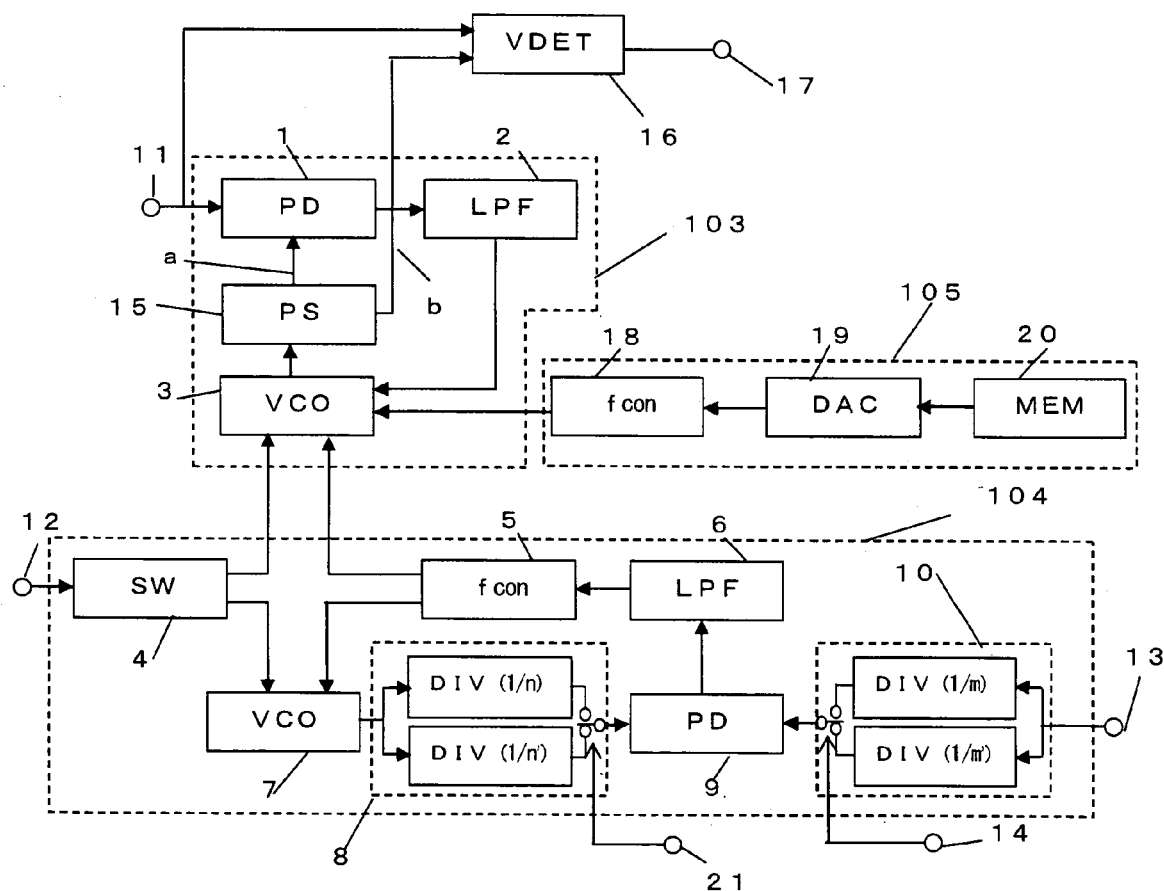
FIG. 3 is a block diagram showing the configuration of a PLL circuit according to Embodiment 3 of the present invention.
Figure 4:
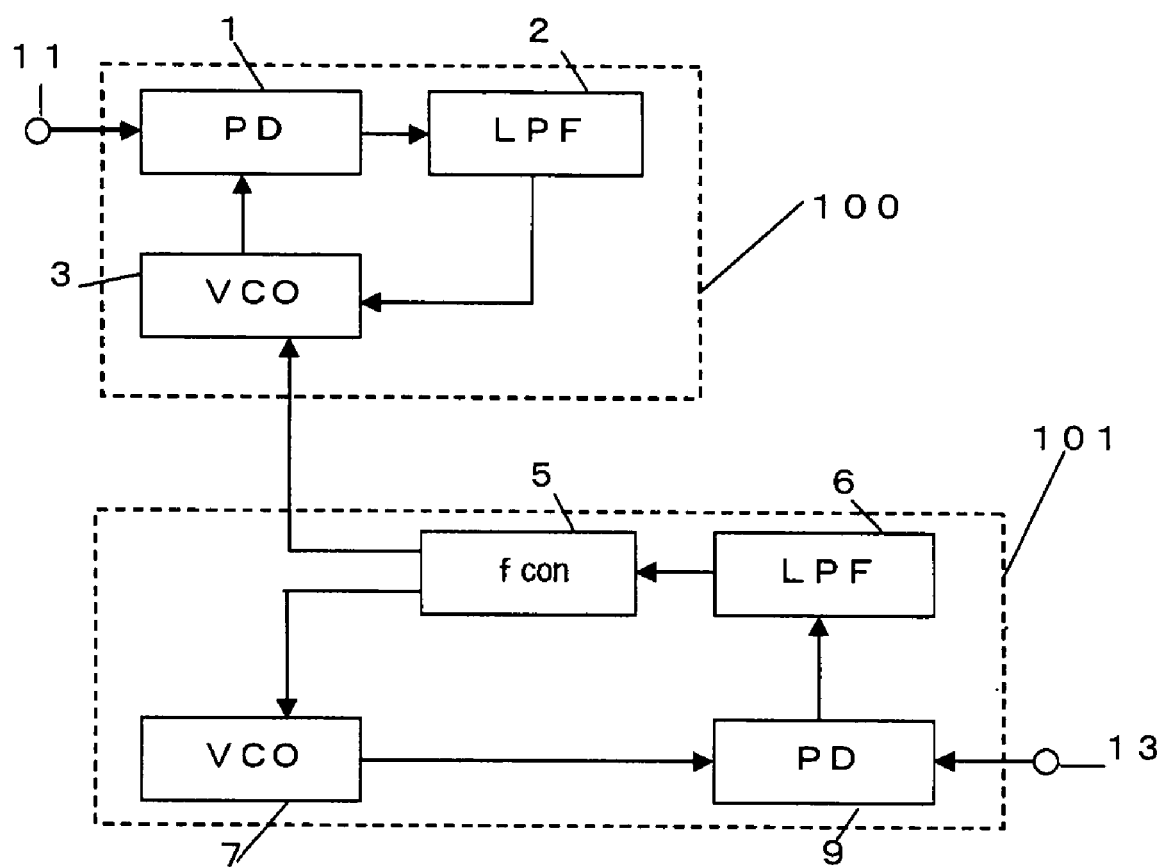
FIG. 4 is a block diagram showing the configuration of a PLL circuit according to the prior art.
Figure 5:
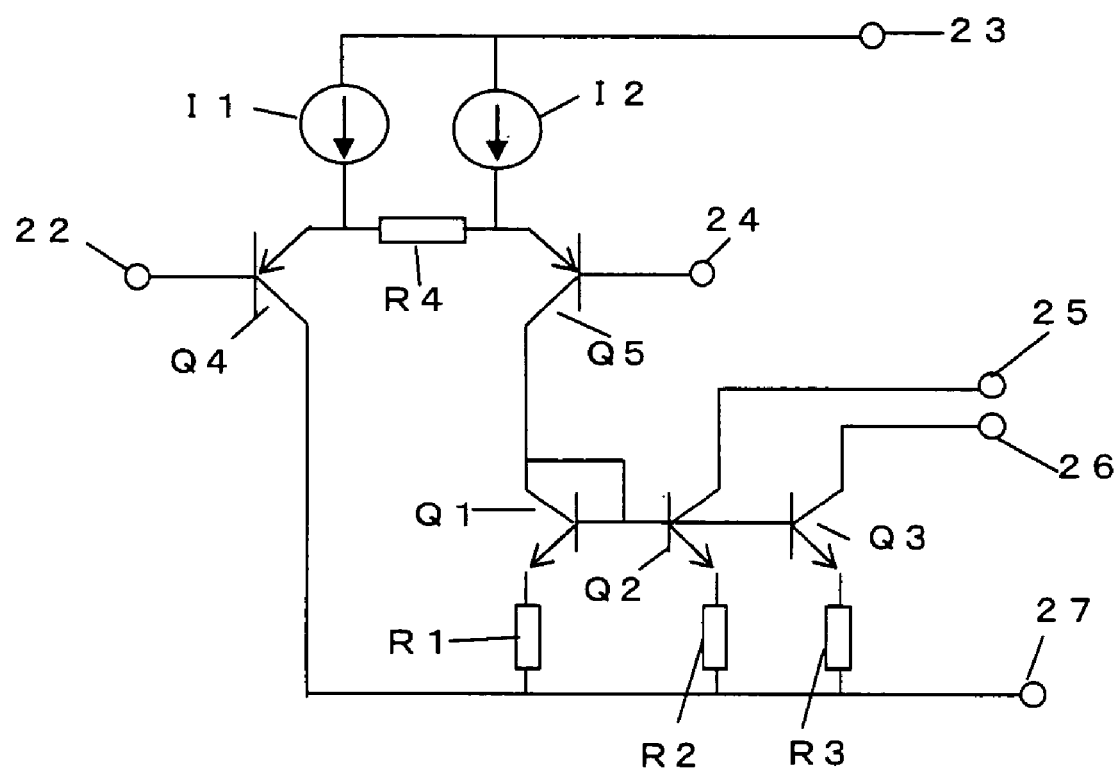
FIG. 5 is a circuit diagram showing the configuration of a frequency control circuit.

FIG. 3 is a block diagram showing the configuration of a PLL circuit according to Embodiment 3 of the present invention, and the same numbers are attached to parts that are the same as those of Embodiment 2.

This PLL circuit is formed of first and second PLL circuit parts 103 and 104, as well as a frequency adjusting circuit 105. First PLL circuit part 103 is formed of a first phase detector 1, a first low pass filter 2, a first voltage controlled oscillator 3 and a phase shifter 15. Second PLL circuit part 104 is formed of a second voltage controlled oscillator 7, a second phase detector 9, a second low pass filter 6, a frequency control circuit 5 for supplying frequency control voltages to first and second voltage controlled oscillators 3 and 7, a first variable frequency divider 10, a second variable frequency divider 8 and a frequency switching circuit 4. Frequency adjusting circuit 5 is formed of a second frequency control circuit 18, a DA converter 19 and a memory device 20.

The operation of the PLL circuit according to Embodiment 3 of the present invention which is formed as described above is described below.

In FIG. 3, PLL circuit parts 103 and 104 which are the same parts as those of FIG. 2 operate as described in reference to FIG. 2. In this embodiment, voltage controlled oscillator 3 and voltage controlled oscillator 7 are formed using the same circuit configuration and the same elements, and in frequency control circuit 5, circuits for outputting frequency control voltages to voltage controlled oscillator 3 and voltage controlled oscillator 7 are respectively formed utilizing the same circuit configuration and the same elements. As a result of this, the free-running frequency is stabilized. However, relative dispersion occurs between the free-running frequencies of the two voltage controlled oscillators 3 and 7, due to dispersion in the elements which are mass produced. This relative dispersion depends on the precision or relative dispersion in the process for mass production of integrated circuits.

Conventionally, the maximum of this dispersion is approximately 1%, and in the case where a frequency having high precision is required, it is necessary to reduce such relative dispersion.

According to Embodiment 3 of the present invention, a frequency correction circuit 105 is added to voltage controlled oscillator 3 so as to reduce relative dispersion.

Frequency correction circuit 105 is formed of frequency control circuit 18, DA converter 19 and memory circuit 20.

DA converter 19 converts bit data of memory circuit 20 to a voltage, and the output thereof is converted to a current through frequency conversion circuit 18, and corrects the oscillatory frequency of voltage controlled oscillator 3.

Memory circuit 20 is formed of a trimming element, such as an IC fuse, or of a semiconductor memory (ROM), and stores in advance a bit pattern for allowing voltage controlled oscillator 3 to provide a desirable frequency, and thereby, the oscillatory frequency of voltage controlled oscillator 3 can be corrected.

Voltage controlled oscillator 3 oscillates at approximately desirably by means of PLL circuit 104, and therefore, it is possible to correct only relative dispersion caused as a result of semiconductor manufacture, so that DA converter 19 can increase the frequency precision with a configuration of only several bits.

As a result of this, a PLL circuit that requires high frequency precision can be formed.

INDUSTRIAL APPLICABILITY

A PLL circuit according to the present invention is a single set of circuits and can handle a number of frequencies, and has as an effect that costs can be reduced in the case where a number of frequencies are handled, which is useful when the PLL circuit is used for a video detector or the like of a television receiver.

The invention claimed is:

1. A PLL circuit, comprising:
   a first voltage controlled oscillator;
   a first phase comparator for detecting a phase difference between an input signal and the output of said first voltage controlled oscillator;
   a first filter into which the output of said first phase comparator is inputted, and which supplies a frequency control voltage to said first voltage controlled oscillator;
   a first variable frequency divider for dividing the reference frequency signal outputted from a reference frequency signal source;
   a second voltage controlled oscillator having the same elements and configuration as said first voltage controlled oscillator;
   a second variable frequency divider for dividing the output of said second voltage controlled oscillator;
   a second phase comparator for detecting a phase difference between the outputs of said first variable frequency divider and said second variable frequency divider;
   a second filter into which the output of said second phase comparator is inputted;
   a frequency control means into which the output of said second filter is inputted, and which respectively controls the frequencies of said first voltage controlled oscillator and said second voltage controlled oscillator, with circuits having the same configuration; and
   a frequency switching means for respectively switching the frequencies of said first voltage controlled oscillator and said second voltage controlled oscillator in accordance with a frequency switching signal, with circuits having the same configuration, wherein
   at least either of said first variable frequency divider and said second variable frequency divider switches the division ratio in accordance with said frequency switching signal.

2. The PLL circuit according to claim 1, wherein said reference frequency signal source is of a frequency switching type, and at least either of said first variable frequency divider and said second variable frequency divider switches the division ratio in accordance with the switching of the frequency of said reference frequency signal source.

3. The PLL circuit according to claim 1, wherein
   said input signal is a video intermediate frequency signal, and
   the PLL circuit further comprises: a phase shifter, which is provided between said first voltage controlled oscillator and said first phase comparator, into which the output of said first voltage controlled oscillator is inputted, which outputs first and second signals having a shift difference of 90 degrees, and which inputs said first signal into said first phase comparator; and a video detector into which said video intermediate frequency signal and the second signal of said phase shifter are inputted, and which carries out a synchronous detection.

4. The PLL circuit according to claim 3, wherein said reference frequency signal source is of a frequency switching type, and at least either of said first variable frequency divider and said second variable frequency divider switches the division ratio in accordance with the switching of the frequency of said reference frequency signal source.

5. The PLL circuit according to claim 3, further comprising a frequency adjusting means for correcting a difference between the frequency of said first voltage controlled oscillator and the free-running frequency of said second voltage controlled oscillator.

* * * * *